(12) United States Patent
Okamoto et al.

(10) Patent No.: US 7,479,820 B2
(45) Date of Patent: Jan. 20, 2009

(54) SEMICONDUCTOR DEVICE INCLUDING DETECTOR CIRCUIT CAPABLE OF PERFORMING HIGH-SPEED OPERATION

(75) Inventors: Mako Okamoto, Hyogo (JP); Fukashi Morishita, Tokyo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 0 days.

(21) Appl. No.: 11/272,798

(22) Filed: Nov. 15, 2005

(65) Prior Publication Data

US 2006/0103434 A1   May 18, 2006

(30) Foreign Application Priority Data

Nov. 17, 2004   (JP) ............................. 2004-332847
Oct. 3, 2005    (JP) ............................. 2005-289854

(51) Int. Cl.
    *G05F 3/02* (2006.01)
(52) U.S. Cl. ...................... 327/535; 327/536; 363/59; 363/60
(58) Field of Classification Search ................ 327/536, 327/535; 363/59, 60
    See application file for complete search history.

(56) References Cited

U.S. PATENT DOCUMENTS

| | | | | |
|---|---|---|---|---|
| 5,553,295 | A * | 9/1996 | Pantelakis et al. ............ 713/300 |
| 6,021,083 | A * | 2/2000 | Shiau et al. ............ 365/230.01 |
| 6,229,379 | B1 * | 5/2001 | Okamoto ................... 327/535 |
| 6,320,438 | B1 * | 11/2001 | Arcus ......................... 327/175 |
| 6,429,725 | B1 * | 8/2002 | Tanzawa et al. ............. 327/536 |
| 6,614,270 | B2 * | 9/2003 | Okamoto et al. ............. 327/77 |
| 6,903,599 | B2 * | 6/2005 | Chen et al. ................... 327/536 |
| 7,015,684 | B2 * | 3/2006 | Chen .......................... 323/316 |
| 2002/0011893 | A1 * | 1/2002 | Takai ......................... 327/534 |
| 2002/0047731 | A1 * | 4/2002 | Okamoto et al. ............. 327/77 |
| 2003/0042970 | A1 * | 3/2003 | Humphrey ................... 327/540 |
| 2003/0102568 | A1 * | 6/2003 | Tomishima ................. 257/777 |
| 2004/0027107 | A1 * | 2/2004 | Braiman ..................... 323/282 |
| 2004/0037154 | A1 * | 2/2004 | Abedifard ............. 365/230.06 |
| 2004/0042322 | A1 * | 3/2004 | Kim et al. ............. 365/230.06 |
| 2004/0156244 | A1 * | 8/2004 | Becker ................... 365/189.11 |
| 2005/0046486 | A1 * | 3/2005 | Miki et al. .................... 331/17 |

FOREIGN PATENT DOCUMENTS

| | | |
|---|---|---|
| JP | 10-239357 | 9/1998 |
| JP | 11-312392 | 11/1999 |

* cited by examiner

*Primary Examiner*—Long Nguyen
*Assistant Examiner*—Ryan C Jager
(74) *Attorney, Agent, or Firm*—Buchanan Ingersoll & Rooney PC

(57) ABSTRACT

A detector circuit and a negative voltage generating circuit capable of performing high-speed operation are provided. A negative voltage generating circuit includes a charge pump circuit, a first voltage divider circuit that makes a voltage division between an output of the charge pump circuit and a power supply to output a detect potential, a reference voltage generating circuit that generates a reference potential, and a comparator circuit that compares the detect potential and the reference potential. The charge pump circuit is driven by an output signal of the comparator circuit and generates the negative voltage. In the first voltage divider circuit, NMOS transistors and make the voltage division between the negative voltage and the power supply to obtain the detect potential.

8 Claims, 12 Drawing Sheets

F I G . 2 A
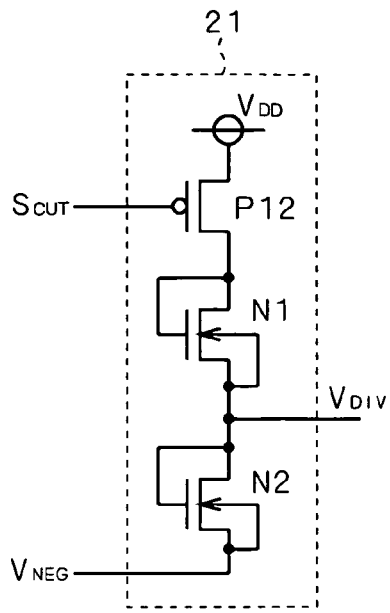
F I G . 2 B
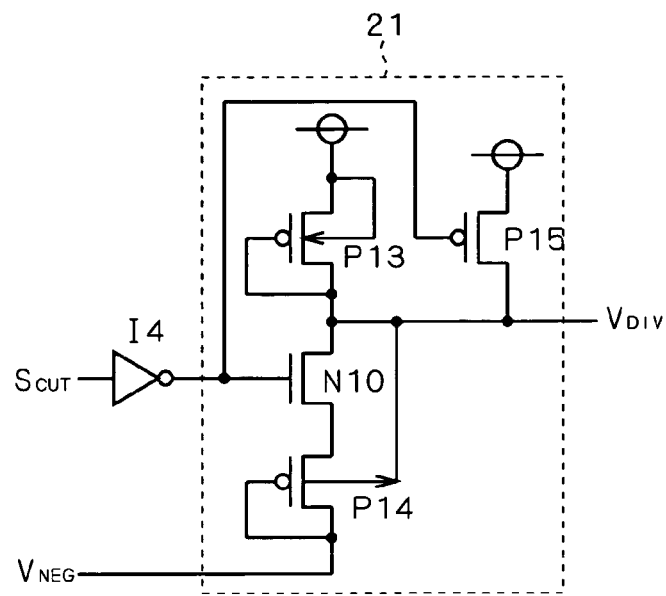
F I G . 3
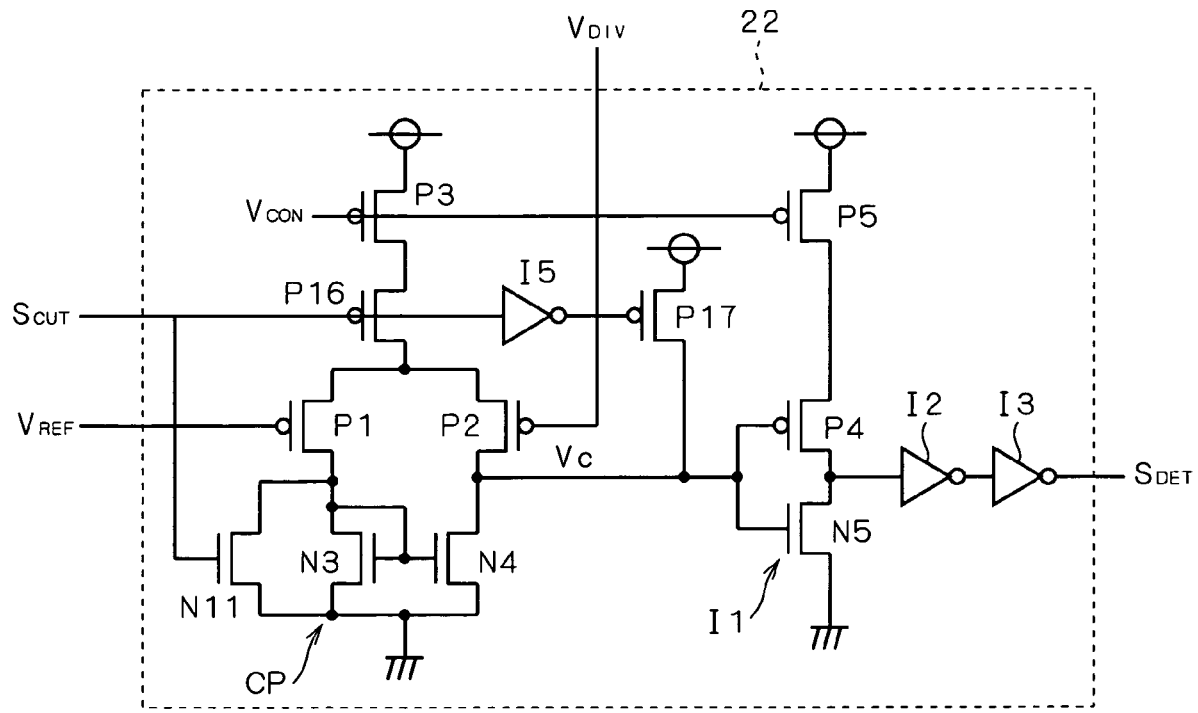

F I G. 6
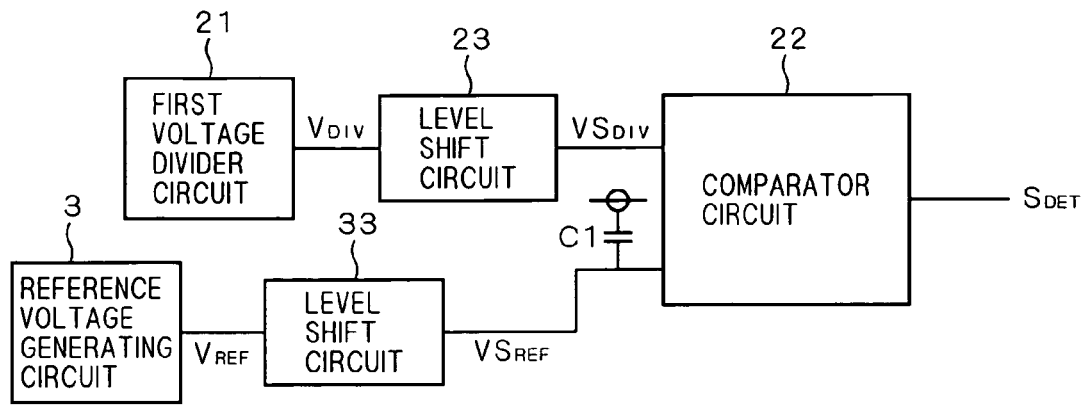
F I G. 7
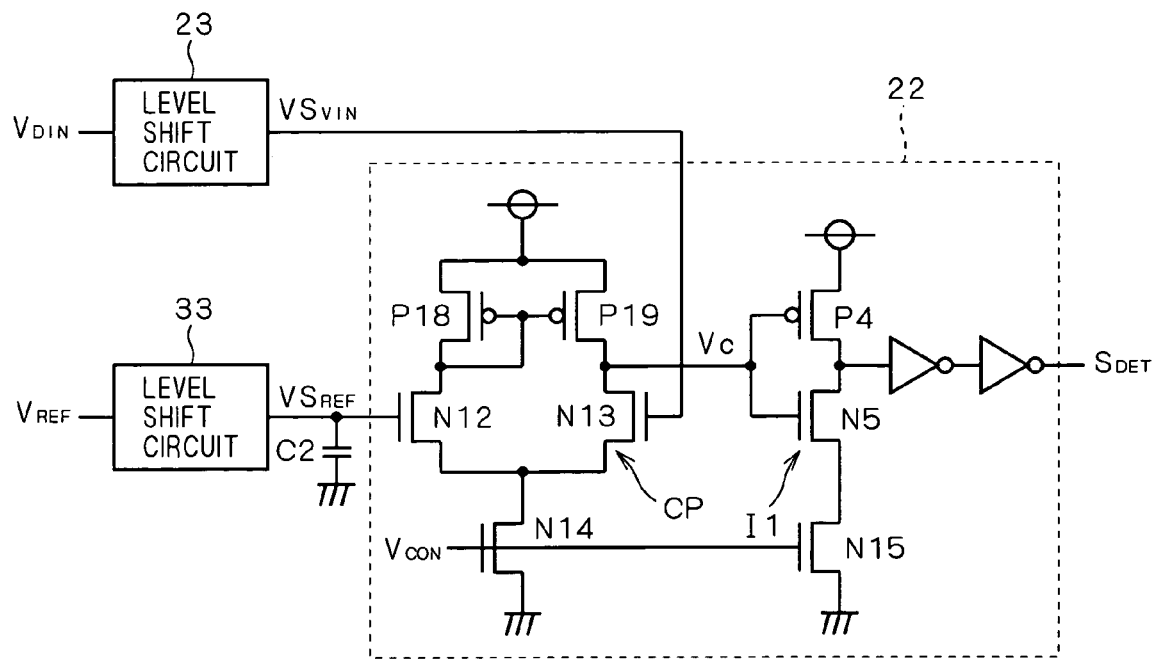

F I G . 8
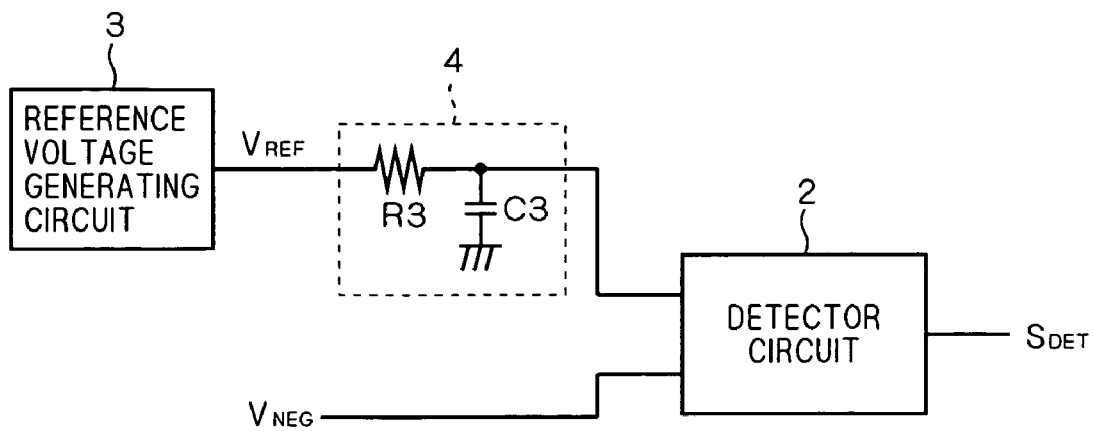
F I G . 9
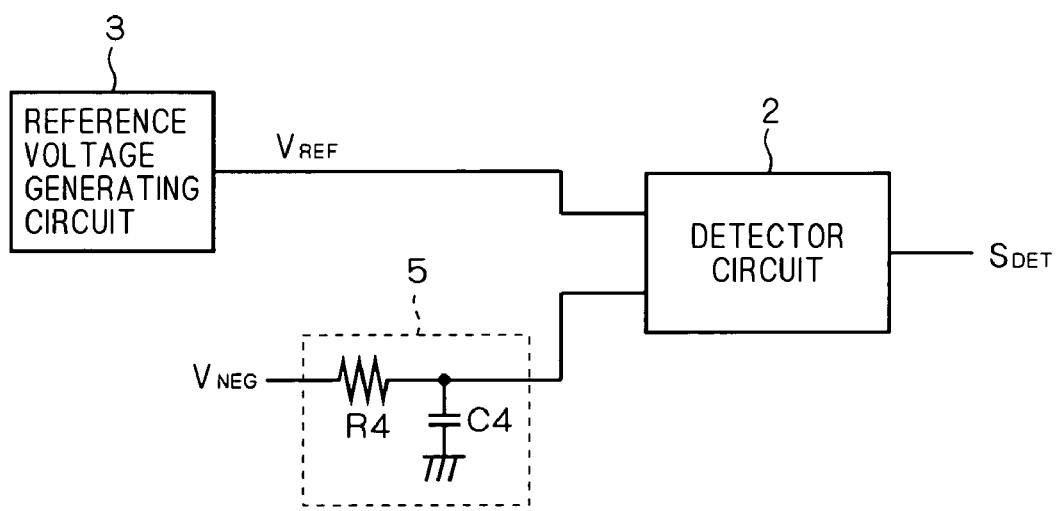

F I G . 1 8
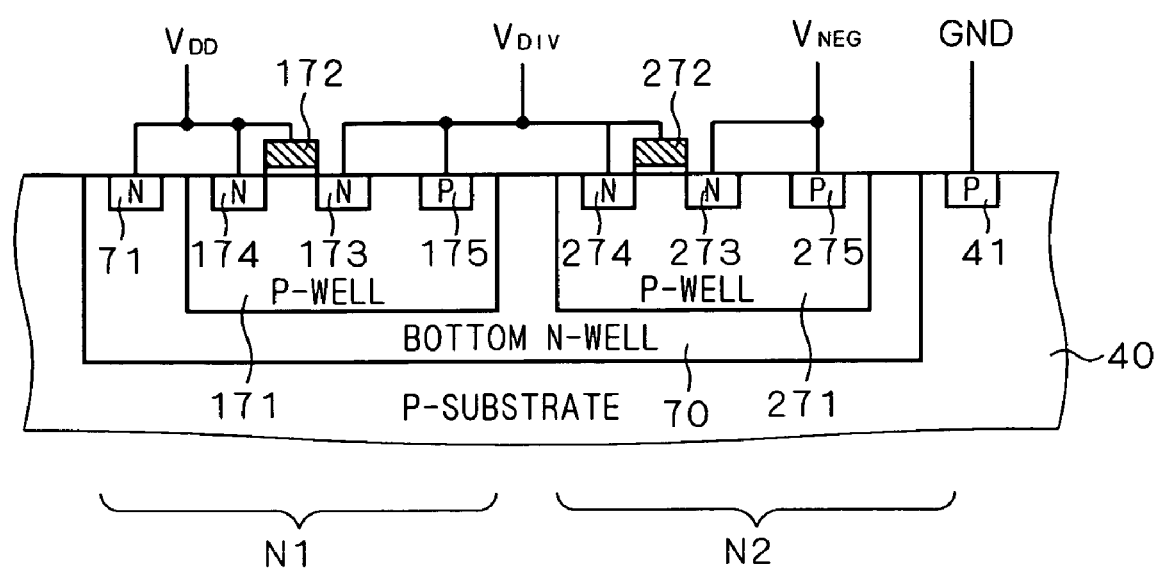

SEMICONDUCTOR DEVICE INCLUDING DETECTOR CIRCUIT CAPABLE OF PERFORMING HIGH-SPEED OPERATION

BACKGROUND OF THE INVENTION

1. Field of the Invention

The present invention relates to a semiconductor device, and especially to a negative voltage generating circuit and a detector circuit provided therein.

2. Description of the Background Art

Usually, a semiconductor device including a DRAM (Dynamic Random Access Memory) is provided with negative voltage generating circuitry for generating a voltage that is negative and lower than the ground (GND) potential (hereinafter referred to as a negative voltage). The negative voltage is used as a substrate bias potential and controls the transistor substrate effect. For example, in a DRAM that uses a PMOS transistor as a memory cell transfer gate, the negative voltage is used as a voltage for driving the transistor (activation voltage). It is necessary to set the transistor driving voltage sufficiently low, in order to write a ground-level signal to the memory cell during write and to extract a signal voltage with a sufficient amplitude from the memory cell during read.

In general, when a negative voltage generated by a negative voltage generating circuit is used as a substrate bias potential, potential variations are suppressed by large capacitance of the substrate, and the negative voltage generating circuit is not required to provide high-speed response. However, when the semiconductor device using the negative voltage as a transistor driving voltage is operated at high speed, the current consumption related to the negative voltage is large and therefore high-speed response of the negative voltage generating circuit is needed. Steadily supplying the negative voltage even when the current consumption related to the negative voltage is large requires quickly detecting potential variations of the negative voltage and feeding power (supplying charge).

Conventional negative voltage generating circuits are disclosed in Japanese Patent Application Laid-Open Nos. 10-239357 (1998) and 11-312392 (1999), for example. The negative voltage generating circuit described in Japanese Patent Application Laid-Open No. 10-239357, for example, includes a charge pump circuit for generating a negative voltage and a detector circuit for detecting the potential of the negative voltage (which is referred to also as "a negative voltage sensing circuit" or "a level detecting circuit"). When detecting the negative voltage becoming higher than a desired value because of current consumption, the detector circuit activates the charge pump circuit to supply charge to the negative voltage output so that the negative voltage keeps the desired value.

In conventional negative voltage generating circuits, the detector circuits do not have high-speed response. Accordingly, when the semiconductor device using the negative voltage as a transistor driving voltage is operated at high speed, the detector circuit may fail to sufficiently follow instantaneous variations of the negative voltage, which leads to unstable supply of the negative voltage.

Also, breakdown voltages of semiconductor devices are becoming lower because of recent downsizing of LSIs, i.e., miniaturization of transistors, which unavoidably leads to lower operating voltages (power-supply voltages). Moreover, battery-driven portable devices, for example, demand reduction of power consumption through reduction of operating voltage and reduction of consumption current. However, lower operating voltage further deteriorates the detector circuit response and reduces the stability of the negative voltage generating circuit. This hinders reduction of power consumption of the semiconductor devices.

SUMMARY OF THE INVENTION

An object of the present invention is to provide a semiconductor device including a detector circuit that is capable of performing stable high-speed operation and a negative voltage generating circuit having the detector circuit.

In an aspect of the invention, a semiconductor device includes a detector circuit that detects a level of a negative voltage. The detector circuit includes: a first voltage divider circuit that outputs a detect potential generated by a voltage division made by a plurality of MOS transistors connected in series between a potential of the negative voltage and a positive power-supply potential; and a comparator circuit that compares the detect potential and a predetermined reference potential.

The first voltage divider circuit included in the detector circuit is composed of a plurality of MOS transistors. Accordingly, the detect potential quickly varies following a variation of the negative voltage because of the effect of capacitive coupling by the gate capacitance and parasitic capacitance of the MOS transistors. This enables the comparator circuit to detect the variation of the negative voltage quickly, thus offering high-speed response.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2A, 2B and 3 are diagrams used to describe a negative voltage generating circuit according to a third preferred embodiment;

FIG. 6 is a diagram illustrating the configuration of a negative voltage generating circuit according to a sixth preferred embodiment;

FIG. 7 is a diagram showing a modification of the comparator circuit of the negative voltage generating circuit according to the sixth preferred embodiment;

FIG. 8 is a diagram illustrating the configuration of a negative voltage generating circuit according to a seventh preferred embodiment;

FIG. 9 is a diagram illustrating the configuration of a negative voltage generating circuit according to an eighth preferred embodiment;

FIG. 18 is a cross-sectional view of the first voltage divider circuit according to the tenth preferred embodiment.

DESCRIPTION OF THE PREFERRED EMBODIMENTS

The preferred embodiments of the present invention will now be described. In this specification, for the sake of simplicity of description, when the potential of a negative voltage is low (i.e., when the absolute value of the negative voltage is large), it may be expressed as "the negative voltage is deep". On the other hand, when the potential of the negative voltage is high (i.e., when the absolute value of the negative voltage is small), it may be expressed as "the negative voltage is shallow".

First Preferred Embodiment

Figure 1:
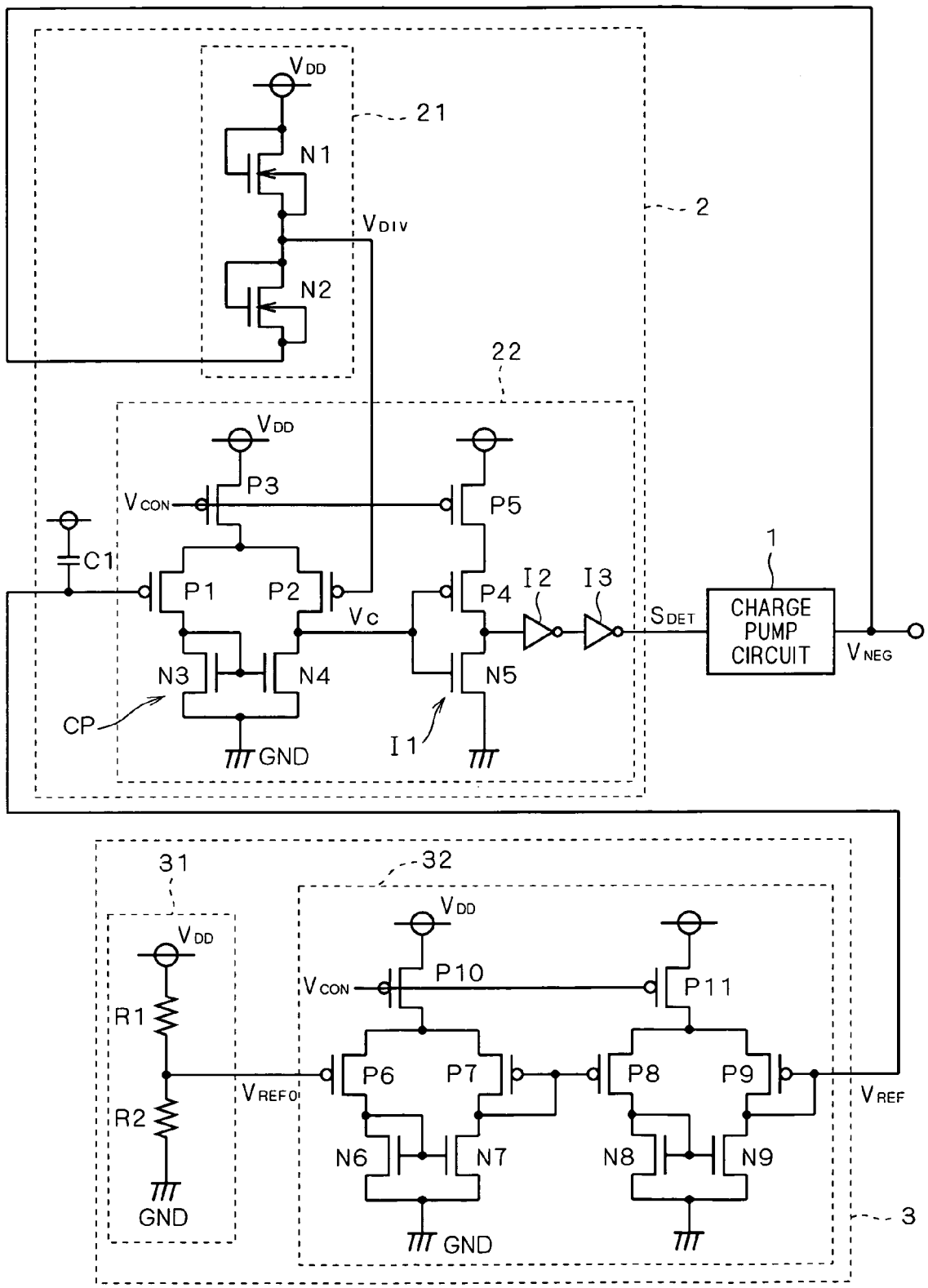
FIG. 1 is a diagram illustrating the configuration of a negative voltage generating circuit according to a first preferred embodiment.

FIG. 1 is a diagram illustrating the configuration of a negative voltage generating circuit included in a semiconductor device according to a first preferred embodiment of the present invention. As shown in FIG. 1, the negative voltage generating circuit includes a charge pump circuit 1, a detector circuit 2, and a reference voltage generating circuit 3.

The charge pump circuit 1 is driven by an output signal of the detector circuit 2 ("detect signal $S_{DET}$" described later) and generates and outputs a predetermined negative voltage $V_{NEG}$.

The detector circuit 2 includes a first voltage divider circuit 21 and a comparator circuit 22. The first voltage divider circuit 21 includes two diode-connected NMOS transistors N1 and N2, where the NMOS transistors N1 and N2 make a voltage division between the output of the charge pump circuit 1 (the negative voltage $V_{NEG}$) and a power supply $V_{DD}$ as a positive potential, and the first voltage divider circuit 21 outputs the obtained potential $V_{DIV}$ (the potential at a node connecting the NMOS transistor N1 and the NMOS transistor N2, which is hereinafter referred to as "detect potential $V_{DIV}$").

In this preferred embodiment, the channel width sizes of the NMOS transistors N1 and N2 are set equal to each other. That is, the voltage division ratio of the first voltage divider circuit 21 is 1/2 and the detect potential $V_{DIV}$ is given as $V_{DIV}=(V_{DD}+V_{NEG})/2$. The detect potential $V_{DIV}$ is inputted to the comparator circuit 22.

The comparator circuit 22 compares the detect potential $V_{DIV}$ outputted from the first voltage divider circuit 21 and a predetermined reference potential $V_{REF}$ outputted from the reference voltage generating circuit 3 to detect the level of the negative voltage $V_{NEG}$. That is, when the negative voltage $V_{NEG}$ is deeper than a given value, the detect potential $V_{DIV}$ is smaller than the reference potential $V_{REF}$ and the detect signal $S_{DET}$ outputted from the comparator circuit 22 is kept at an L (Low) level. When the negative voltage $V_{NEG}$ becomes shallower than a given value, the detect signal $S_{DET}$ varies to an H (High) level.

As shown in FIG. 1, the comparator circuit 22 includes a comparator CP and inverters I1 to I3 provided in its output stage. The inverters I1 to I3 wave-shape an output voltage $V_C$ from the comparator CP to convert it into the detect signal $S_{DET}$ as a logical signal.

The comparator CP includes PMOS transistors P1 and P2 forming a differential pair, NMOS transistors N3 and N4 forming a current mirror circuit as a load, and a PMOS transistor P3 functioning as a constant-current source. That is, the comparator CP is a so-called "current mirror type differential amplifier".

Also, a PMOS transistor P5 is provided to give a constant current to the inverter I1 (a PMOS transistor P4 and an NMOS transistor N5) that receives the output voltage $V_C$ from the comparator CP. A constant voltage $V_{CON}$ is applied to the gates of both of the PMOS transistor P3 and the PMOS transistor P5.

In this circuit configuration, the response speeds of the comparator CP and the inverter I1 are determined by the magnitudes of the currents supplied through the PMOS transistors P3 and P5. That is, by keeping the voltage $V_{CON}$ constant, the response speeds of the comparator CP and the inverter I1 are kept constant without depending on the voltage of the power supply $V_{DD}$.

The PMOS transistors P3 and P5 function also to restrict to given values the through currents flowing from the power supply $V_{DD}$ to the ground GND through the comparator CP and the inverter I1, thereby suppressing the current consumption of the comparator CP and the inverter I1. The current values supplied from the PMOS transistors P3 and P5 can be adjusted by adjusting the magnitude of the voltage $V_{CON}$ applied to their gates or by adjusting the channel width sizes.

As mentioned earlier, the charge pump circuit 1 is driven by the detect signal $S_{DET}$. That is, the charge pump circuit 1 is activated when the detect signal $S_{DET}$ attains the H level, and then supplies charge to the output node to deepen the negative voltage $V_{NEG}$. When the negative voltage $V_{NEG}$ becomes deeper than a particular value, the detect signal $S_{DET}$ goes to the L level and then the charge pump circuit 1 is inactivated and stops the supply of charge. The charge pump circuit 1 thus operates according to the detect signal $S_{DET}$ so as to keep the negative voltage $V_{NEG}$ at a value based on the level of the reference potential $V_{REF}$.

The reference voltage generating circuit 3, for generating the reference potential $V_{REF}$, includes a second voltage divider circuit 31 and a buffer circuit 32. The second voltage divider circuit 31 includes two resistors R1 and R2, where the resistors R1 and R2 make a voltage division between the ground GND and the power supply $V_{DD}$ and the second voltage divider circuit 31 outputs the obtained predetermined potential $V_{REFO}$ (the potential of a node connecting the resistor R1 and the resistor R2).

In this preferred embodiment, the resistance values n [Ω] and m [Ω] of the resistors R1 and R2 in the second voltage divider circuit 31 are set equal to each other. That is, the voltage division ratio is 1/2 as in the first voltage divider circuit 21, and $V_{REFO}=V_{DD}/2$. The potential $V_{REFO}$ outputted from the second voltage divider circuit 31 is inputted to the buffer circuit 32 (adjustment circuit). The buffer circuit 32 makes the magnitude of the potential $V_{REFO}$ smaller by a predetermined adjustment value and outputs it as the reference potential $V_{REF}$.

As shown in FIG. 1, the buffer circuit 32 includes PMOS transistors P6 to P11 and NMOS transistors N6 to N9. The transistors P10 and P11, both receiving a constant voltage $V_{CON}$ at their gates, pass constant current to the buffer circuit 32 and restrict the through current flowing through the buffer circuit 32 to suppress current consumption. The current values supplied from the PMOS transistors P10 and P11 can be adjusted by adjusting the magnitude of the voltage $V_{CON}$ applied to their gates or by adjusting the channel width sizes.

When the channel width sizes of the PMOS transistors P6, P7, P8 and P9 and the NMOS transistors N6, N7, N8 and N9 are defined as $W_{P6}$, $W_{P7}$, $W_{P8}$, $W_{P9}$, $W_{N6}$, $W_{N7}$, $W_{N8}$ and $W_{N9}$, and the gradient of the transistors' $I_{ds}$-$V_g$ characteristic ($I_{ds}$: drain-source current, $V_g$: gate voltage) in the sub-threshold region, with the logarithm of $I_{ds}$, is defined as S (the quantity of variation of the gate voltage required for a one-digit variation of the current (the so-called S factor)), then the reference potential $V_{REF}$ outputted from the buffer circuit 32 is given as:

$$V_{REF}=V_{REFO}+S\times\log((W_{P7}\times W_{N6}\times W_{P9}\times W_{N8})/(W_{N7}\times W_{P6}\times W_{N9}\times W_{P8})).$$

Where, when the channel width sizes of the PMOS transistors P6 to P9 and the NMOS transistors N6 to N9 are set as:

$$(W_{P7}\times W_{N6}\times W_{P9}\times W_{N8})<(W_{N7}\times W_{P6}\times W_{N9}\times W_{P8}),$$

then the reference potential $V_{REF}$ is lower than the output potential $V_{REFO}$ of the second voltage divider circuit 31. Then, when a definition is given as:

$$\Delta V=|S\times\log((W_{P7}\times W_{N6}\times W_{P9}\times W_{N8})/(W_{N7}\times W_{P6}\times W_{N9}\times W_{P8}))|,$$

the expression of the reference potential $V_{REF}$ is given as:

$$V_{REF}=V_{REFO}-\Delta V.$$

That is, $\Delta V$ corresponds to the "adjustment value" mentioned above.

The reference potential $V_{REF}$ outputted from the buffer circuit 32 is inputted to the comparator circuit 22 (the comparator CP). The capacitor C1 is provided to stabilize the reference potential $V_{REF}$.

The operation of the negative voltage generating circuit according to the preferred embodiment will be described below. In this preferred embodiment, $V_{DIV}=(V_{DD}+V_{NEG})/2$ and $V_{REF}=V_{REFO}-\Delta V=V_{DD}/2-\Delta V$, so that the detector circuit 2 outputs the detect signal $S_{DET}$ at the H level when $V_{NEG}/2>-\Delta V$, and outputs the detect signal $S_{DET}$ at the L level when $V_{NEG}/2<-\Delta V$. That is, the detector circuit 2 operates to detect the negative voltage $V_{NEG}$ so that $V_{NEG}=-\Delta V\times 2$.

The detect signal $S_{DET}$ outputted from the detector circuit 2 is inputted to the charge pump circuit 1, and the charge pump circuit 1 is driven by the detect signal $S_{DET}$. When the negative voltage $V_{NEG}$ is shallower than $-\Delta V\times 2$, the detect signal $S_{DET}$ is at the H level and the charge pump circuit 1 is activated to deepen the negative voltage $V_{NEG}$. When the negative voltage $V_{NEG}$ reaches $-\Delta V\times 2$ and the detect signal $S_{DET}$ goes to the L level, the charge pump circuit 1 is then inactivated and stops the supply of charge to the negative voltage $V_{NEG}$ output node. The negative voltage generating circuit thus keeps the output of the negative voltage $V_{NEG}$ so that $V_{NEG}=-\Delta V\times 2$.

As is known from the description above, the value of the negative voltage $V_{NEG}$ outputted from the negative voltage generating circuit of the preferred embodiment can be adjusted by varying the value of $\Delta V$ by adjusting the channel width sizes of the PMOS transistors P6 to P9 and the NMOS transistors N6 to N9 of the buffer circuit 32.

When the negative voltage $V_{NEG}$ instantaneously varies because of, e.g., current consumption of the device that uses the negative voltage $V_{NEG}$ as a driving voltage, the detect potential $V_{DIV}(=(V_{DD}+V_{NEG})/2)$ varies. According to the present invention, since the first voltage divider circuit 21 is composed of the NMOS transistors N1 and N2, the detect potential $V_{DIV}$ quickly varies following the variation of the negative voltage $V_{NEG}$ because of the effect of capacitive coupling by the gate capacitance and parasitic capacitance of the NMOS transistors N1 and N2. This offers high-speed response superior to those of conventional detector circuits.

Also, as described earlier, the response speeds of the comparator CP and the inverter I1 are determined by the magnitudes of the currents supplied through the PMOS transistors P3 and P5, and are hardly affected by the power-supply voltage $V_{DD}$. For example, increasing the current flowing to the comparator CP shortens the charging/discharging time of the input gate of the next-stage inverter I1, which enhances the high-speed response of the comparator CP. Also, the high-speed response of the inverter I1 can be enhanced by increasing the current flowing to the inverter I1. Thus, the negative voltage generating circuit of the preferred embodiment is capable of performing high-speed operation even when the power-supply voltage is low.

However, as mentioned earlier, the PMOS transistors P3 and P5 have a function of suppressing the current consumption by restricting the currents flowing in the comparator CP and the inverter I1 to given values, and therefore it is not preferred that the PMOS transistors P3 and P5 supply excessively large current values. Accordingly, it is desirable to properly set the current values in accordance with the purpose of use of the negative voltage generating circuit. The current values supplied from the PMOS transistors P3 and P5 can be controlled by adjusting the magnitude of the voltage $V_{CON}$ applied to the gates of the PMOS transistors P3 and P5 or by adjusting the channel width sizes of the PMOS transistors P3 and P5.

As described so far, according to this preferred embodiment, the NMOS transistors N1 and N2 in the first voltage divider circuit 21 make a voltage division between the power supply $V_{DD}$ and the negative voltage $V_{NEG}$ to obtain the detect potential $V_{DIV}$, so that the detect potential $V_{DIV}$ quickly responds to variations of the negative voltage $V_{NEG}$. Also, the response speeds of the comparator CP and the inverter I1 are independent of the voltage of the power supply $V_{DD}$ and are determined by the current values supplied from the PMOS transistors P3 and P5. Therefore, the detector circuit 2 and the negative voltage generating circuit including the detector circuit 2 are capable of performing high-speed operation even when the power-supply voltage is low. This contributes to achievement of higher-speed operation of the semiconductor device and reduction of power consumption.

Second Preferred Embodiment

In the first preferred embodiment, the voltage division ratio of the first voltage divider circuit 21 and the voltage division ratio of the second voltage divider circuit 31 are set equal to each other. In this case, the value of the negative voltage $V_{NEG}$ outputted from the negative voltage generating circuit does not depend on the potential of the power supply $V_{DD}$. In the first preferred embodiment, for example, the voltage division ratio of the first voltage divider circuit 21 and the voltage division ratio of the second voltage divider circuit 31 are both 1/2, and therefore $V_{NEG}=-\Delta V\times 2$, which shows that the negative voltage $V_{NEG}$ does not depend on the potential of the power supply $V_{DD}$.

On the other hand, in a second preferred embodiment, the resistance value of the resistor R1 of the second voltage divider circuit 31 and the resistance value of the resistor R2 are set at different values so that the negative voltage $V_{NEG}$ varies depending on the potential of the power supply $V_{DD}$.

That is, in this preferred embodiment, the voltage division ratio of the second voltage divider circuit 31 is adjusted to be different from the voltage division ratio (1/2) of the first voltage divider circuit 21. Herein, for the sake of simplicity, the voltage division ratio of the first voltage divider circuit 21 is left at 1/2, but the value of the voltage division ratio of the first voltage divider circuit 21 may be adjusted. However, adjusting the voltage division ratio of the second voltage divider circuit 31 is easier because changing the voltage division ratio of the first voltage divider circuit 21 requires changing the channel width sizes of the NMOS transistors N1 and N2.

When the resistance values of the resistors R1 and R2 of the second voltage divider circuit 31 are represented respectively as n [Ω] and m [Ω] (n≠m), then the output potential $V_{REFO}$ of the second voltage divider circuit 31 is given as:

$$V_{REFO}=V_{DD} \times m/(m+n)=V_{DD}/2-V_{DD} \times (n-m)/(2n+2m).$$

From the relation $V_{REF}=V_{REFO}-\Delta V$, the detect potential of the detector circuit 2, i.e., the negative voltage $V_{NEG}$ outputted from the negative voltage generating circuit, is given as:

$$V_{NEG}=(-V_{DD} \times (n-m)/(2n+2m)-\Delta V) \times 2.$$

As is known from the expression, the negative voltage $V_{NEG}$ has dependence on the power-supply potential $V_{DD}$ when n≠m.

Now, when m<n, the negative voltage $V_{NEG}$ varies to become deeper in proportion to the power-supply potential $V_{DD}$. This is effective when the negative voltage $V_{NEG}$ is used as the well potential of an NMOS transistor, for example. That is, when the NMOS transistor turns off and the drain voltage attains the power-supply potential $V_{DD}$, leakage current increases when the power-supply potential $V_{DD}$ is high. However, the leakage current is reduced when the well potential (the negative voltage $V_{NEG}$) varies to be deeper in proportion to the power-supply potential $V_{DD}$.

On the other hand, when m>n, the negative voltage $V_{NEG}$ varies to become shallower in proportion to the power-supply potential $V_{DD}$. For example, when the power-supply potential $V_{DD}$ and the potential of the negative voltage $V_{NEG}$ are applied between the source and drain of a transistor, the electric field is alleviated even when the power-supply potential $V_{DD}$ is high, which improves the reliability of the breakdown voltage of the transistor.

As described in this preferred embodiment, the negative voltage $V_{NEG}$ outputted from the negative voltage generating circuit has dependence on the power-supply potential $V_{DD}$ when the voltage division ratio of the first voltage divider circuit 21 and the voltage division ratio of the second voltage divider circuit 31 are set at different values. This enables the negative voltage generating circuit to be suitably used according to the purpose of use.

Third Preferred Embodiment

In this preferred embodiment, the negative voltage generating circuit of the first preferred embodiment is provided with a current cut (shutdown) function for preventing unnecessary current consumption. That is, when the operation of the detector circuit 2 is not needed, a "current cut mode" is selected to cut off the current flowing in the detector circuit, and the detector circuit 2 is placed in an idle state to reduce the power consumption.

FIGS. 2A, 2B, and 3 are diagrams used to describe the negative voltage generating circuit according to a third preferred embodiment. FIGS. 2A and 2B are circuit diagrams showing examples of the first voltage divider circuit 21 of the negative voltage generating circuit, and FIG. 3 is a circuit diagram of the comparator circuit 22 of the negative voltage generating circuit. Except for the first voltage divider circuit 21 and the comparator circuit 22, the configuration of the negative voltage generating circuit of this preferred embodiment is the same as that shown in FIG. 1. Therefore, only the first voltage divider circuit 21 and the comparator circuit 22 will be described below and the remaining components are not described here again.

When the first voltage divider circuit 21 is formed of two NMOS transistors (NMOS transistors N1 and N2) as shown in FIG. 1, the current cut function can be given to the first voltage divider circuit 21 with the configuration shown in FIG. 2A, for example. That is, a PMOS transistor P12 is connected in series with the NMOS transistors N1 and N2 to serve as a switching element for cutting off the current flowing to the NMOS transistors N1 and N2.

The gate of the PMOS transistor P12 receives a current cut signal $S_{CUT}$ as a control signal for placing the detector circuit 2 in the current cut mode. When the current cut signal $S_{CUT}$ goes to an H level, the PMOS transistor P12 turns off and cuts off the current flowing from the power supply $V_{DD}$ to the negative voltage $V_{NEG}$ node (the output terminal of the charge pump circuit 1) through the first voltage divider circuit 21 (the NMOS transistors N1 and N2).

However, when the first voltage divider circuit 21 is formed of NMOS transistors, there is a need to give dedicated P well potentials, which requires isolation of the P wells. In this case, the formation requires a relatively large area to surround the bottoms of the P wells with an N well.

Accordingly, the first voltage divider circuit 21 may be formed of PMOS transistors. When the first voltage divider circuit 21 is formed of PMOS transistors, there is no need to surround the bottoms of the dedicated N wells with a P well, which contributes to reduction of the formation area. The first voltage divider circuit 21 formed of PMOS transistors can be given the current cut function with the configuration as shown in FIG. 2B, for example.

That is, the first voltage divider circuit 21, for making a voltage division between the power supply $V_{DD}$ and the negative voltage $V_{NEG}$, is formed of PMOS transistors P13 and P14, and an NMOS transistor N10 is provided between them as a switching element for cutting off the current flowing thereto. Also, in order to prevent floating of the well potential of the PMOS transistor P14 connected on the negative voltage $V_{NEG}$ side, a PMOS transistor P15 is provided to fix the detect potential $V_{DIV}$ at the power supply $V_{DD}$.

The gates of the NMOS transistor N10 and the PMOS transistor P15 receive an inversion of the current cut signal $S_{CUT}$ that is inverted by an inverter I4. The inverted signal goes to an L level when the current cut signal $S_{CUT}$ goes to an H level, and then the NMOS transistor N10 turns off to cut off the current flowing from the power supply $V_{DD}$ to the negative voltage $V_{NEG}$ node (the output terminal of the charge pump circuit 1). At the same time, the PMOS transistor P15 turns on and fixes the well potential of the PMOS transistor P14 at the detect potential $V_{DIV}$.

Thus, in the negative voltage generating circuit, giving a current cut function as shown in FIG. 2A or 2B to the first voltage divider circuit 21 reduces the current consumption when the operation of the detector circuit 2 is not needed. This is effective when removal of the current flowing between $V_{DD}$ and negative voltage $V_{NEG}$ is desired, such as when the device using the negative voltage generating circuit has a low power consumption mode or when an evaluation of the device is made.

FIG. 3 shows a circuit configuration in which the comparator circuit 22 has a current cut function. That is, a PMOS transistor P16 is provided in series with the PMOS transistor P3 that supplies a constant current to the comparator CP, so that the through current flowing from the power supply $V_{DD}$ to the negative voltage $V_{NEG}$ through the comparator CP can be cut off in the current cut mode. Also, an NMOS transistor N11 is provided in parallel with the NMOS transistor N3 so that the gate potential of the NMOS transistors N3 and N4, forming a current mirror circuit, can be fixed at the ground GND level in the current cut mode. Furthermore, a PMOS transistor P17 is connected between the input end of the inverter I1 and the power supply $V_{DD}$ so that the input to the inverter I1 (i.e., the output node of the comparator CP) can be fixed at the H level in the current cut mode.

The PMOS transistor P16 and the NMOS transistor N11 receive the above-mentioned current cut signal $S_{CUT}$ and the PMOS transistor P17 receives an inversion of the current cut signal $S_{CUT}$ through an inverter I5.

When the current cut signal $S_{CUT}$ goes to the H level, the PMOS transistor P16 turns off and cuts off the through current of the comparator CP. At the same time, the PMOS transistor P17 turns on and fixes the input of the inverter I1 at the H level to prevent the through current flowing in the inverter I1 (the detect signal $S_{DET}$ goes to the L level at this time and the charge pump circuit 1 is inactivated). Also, the NMOS transistor N11 turns on and turns off the NMOS transistors N3 and N4, thus preventing generation of through current flowing through the PMOS transistor P17 and the NMOS transistor N4. That is, the NMOS transistor N11, the PMOS transistors P16, P17, and the inverter I5 form a through current cutting off circuit that cuts off the through current flowing in the comparator circuit 22.

When the first voltage divider circuit 21 of FIG. 2A or 2B is combined with the comparator circuit 22 of FIG. 3 to form a detector circuit 2, it is possible to cut the consumption current of the entire detector circuit 2 in the current cut mode.

Fourth Preferred Embodiment

In the configuration of the negative voltage generating circuit shown in FIG. 1, when the potential of the power supply $V_{DD}$ is not sufficiently high in a transition state at the time of turning-on of the power supply, the reference potential $V_{REF}$ stays close to the potential of the ground GND. At this time, current flows to the PMOS transistors P1 and P2 of the comparator CP but current does not flow to the NMOS transistors N3 and N4, and the output of the comparator CP exhibits an H level. During this period, the detector circuit 2 outputs the detect signal $S_{DET}$ at the L level and so the charge pump circuit 1 stays inactive. As a result, the start of the operation of the charge pump circuit 1 is delayed, which lengthens the activation time of the negative voltage generating circuit.

Accordingly, in a fourth preferred embodiment, the detector circuit 2 is configured to output the detect signal $S_{DET}$ that activates the charge pump circuit 1 (i.e., the detect signal $S_{DET}$ at the H level) during a transition at the turning-on of the power supply.

Figure 4:
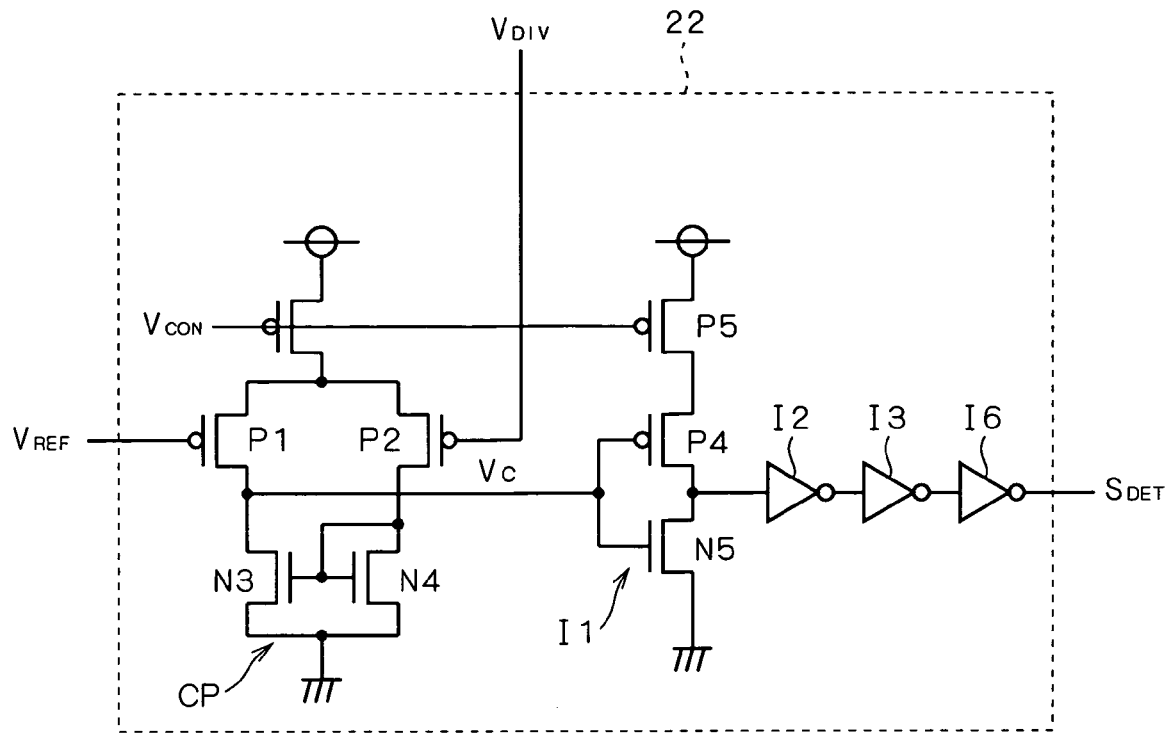
FIG. 4 is a diagram illustrating the configuration of a comparator circuit of a negative voltage generating circuit according to a fourth preferred embodiment.

FIG. 4 is a diagram illustrating the configuration of the comparator circuit 22 of the negative voltage generating circuit of this preferred embodiment. Except for the comparator circuit 22, the circuit configuration is the same as that shown in FIG. 1, and therefore only the configuration of the comparator circuit 22 will be described below and the remaining components are not described again.

In this preferred embodiment, as shown in FIG. 4, the polarities (H level/L level) of the output voltage $V_C$ of the comparator CP are reversed as compared with those of FIG. 1. An inverter I6 is added so that the detect signal $S_{DET}$ outputted from the detector circuit 2 presents the same logical value as that of FIG. 1.

In the comparator circuit 22 of FIG. 4, when the power-supply voltage is not sufficiently high, the logical value of the detect signal $S_{DET}$ is different from that of the configuration of FIG. 1. That is, as mentioned above, when the potential of the power supply $V_{DD}$ is not sufficiently high during a transition at a turning-on of the power supply, current flows to the PMOS transistors P1 and P2 of the comparator CP but current does not flow to the NMOS transistors N3 and N4. The output voltage $V_C$ of the comparator CP of FIG. 4 is then at the H level. Then, the detector circuit 2 (the inverter I6) outputs the detect signal $S_{DET}$ at the H level and the charge pump circuit 1 is activated. That is, the charge pump circuit 1 is activated immediately after the power supply is turned on, which shortens the activation time of the negative voltage generating circuit.

When the power supply $V_{DD}$ attains a sufficiently high value, the detector circuit 2 performs ordinary level detecting operation. At this time, the polarity of the output voltage $V_C$ of the comparator CP of FIG. 4 is opposite to that of FIG. 1, but the detector circuit 2 performs the same operation as that of FIG. 1 because of the presence of the inverter I6 in the output stage of the detector circuit 2.

According to this preferred embodiment, the charge pump circuit 1 is activated immediately after the power supply is turned on, which shortens the activation time of the negative voltage generating circuit. However, with the configuration of the comparator CP of FIG. 4, a large electric field is produced in each transistor immediately after the power supply is turned on, which might deteriorate the reliability of the breakdown voltage. Accordingly, the configuration of FIG. 1, where the charge pump circuit 1 is kept inactive until the power supply $V_{DD}$ becomes sufficiently high, is preferable when the application requires ensuring the breakdown voltage reliability.

Fifth Preferred Embodiment

In a fifth preferred embodiment, the threshold of the inverter I1 receiving the output voltage $V_C$ of the comparator CP is set around the middle between the H level potential and the L level potential of the voltage $V_C$.

Figure 5:
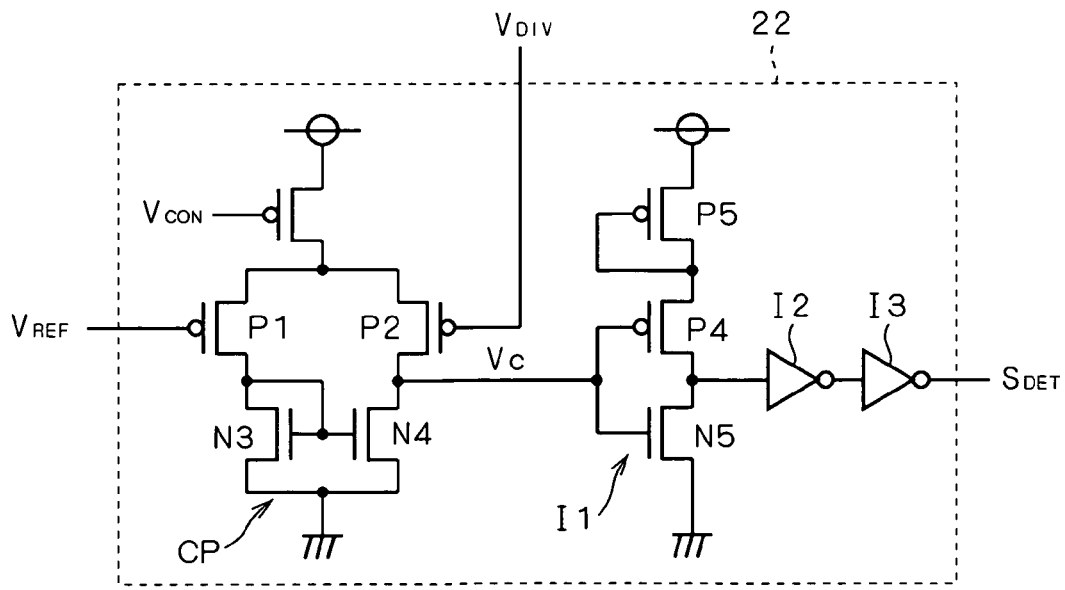
FIG. 5 is a diagram illustrating the configuration of a comparator circuit of a negative voltage generating circuit according to a fifth preferred embodiment.

FIG. 5 is a diagram illustrating the configuration of the comparator circuit 22 of the negative voltage generating circuit of this preferred embodiment. As shown in FIG. 5, the PMOS transistor P5 provided on the power supply $V_{DD}$ side of the inverter I1 is diode-connected. The configuration is the same as that of FIG. 1 except for the configuration of the comparator circuit 22, and therefore only the configuration of the comparator circuit 22 will be described below and the remaining components are not described here again.

The potential of the output voltage $V_C$ of the comparator CP varies in the range from the ground GND to the source potential of the PMOS transistor P2. That is, when the detect potential $V_{DIV}$ is larger than the reference potential $V_{REF}$, the potential of the voltage $V_C$ is approximately equal to the ground GND. On the other hand, when the detect potential $V_{DIV}$ is smaller than the reference potential $V_{REF}$, the potential of the voltage $V_C$ is approximately equal to the source potential of the PMOS transistor P2.

Accordingly, in the preferred embodiment, the diode-connected PMOS transistor P5 is disposed on the power supply $V_{DD}$ side of the inverter I1, and the channel width size of the PMOS transistor P5 is set so that the threshold of the inverter I1 is around the middle between the source potential of the PMOS transistor P2 and the potential GND of the ground GND.

Thus, in this preferred embodiment, the threshold of the inverter I1 receiving the output voltage $V_C$ from the comparator CP is set around the middle between the H level potential and the L level potential of the voltage $V_C$, which enlarges the margin of the amplitude of the output voltage $V_C$ of the comparator CP and enhances the reliability of the operation of the detector circuit 2.

Sixth Preferred Embodiment

In the negative voltage generating circuit shown in FIG. 1, the detect potential $V_{DIV}$ is low when the power supply $V_{DD}$ is low or when the negative voltage $V_{NEG}$ detected by the detector circuit 2 is deep. When the detect potential $V_{DIV}$ is excessively low, the operation of the comparator CP becomes unstable. Accordingly, this preferred embodiment suggests a negative voltage generating circuit that is capable of performing stable operation even when the detect potential $V_{DIV}$ is low.

FIG. 6 is a diagram illustrating the configuration of the negative voltage generating circuit of this preferred embodiment. In FIG. 6, the components corresponding to those of FIG. 1 are shown at the same reference characters (FIG. 6 does not show the charge pump circuit 1). As shown in FIG. 6, a level shift circuit 23 is interposed between the first voltage divider circuit 21 and the comparator circuit 22, and a level shift circuit 33 is interposed between the reference voltage generating circuit 3 and the comparator circuit 22. In other respects, the configuration is the same as that of the negative voltage generating circuit shown in FIG. 1.

The level shift circuit 23 and the level shift circuit 33 raise the detect potential $V_{DIV}$ and the reference potential $V_{REF}$ to particular levels, respectively. That is, in the negative voltage generating circuit of FIG. 6, the comparator circuit 22 receives a potential $VS_{DIV}$ obtained by raising the level of the detect potential $V_{DIV}$ and a potential $VS_{REF}$ obtained by raising the level of the reference potential $V_{REF}$.

Accordingly, even when the power supply $V_{DD}$ is low or when the negative voltage $V_{NEG}$ detected by the detector circuit 2 is deep, the comparator CP receives relatively large signals and so operates stably. This enhances the response of the detector circuit 22 (the detector circuit 2).

When the level shift circuits 23 and 33 precede the comparator circuit 22 as shown in FIG. 6, the comparator circuit 22 may be configured as shown in FIG. 7. That is, the differential pair as the input stage of the comparator CP is formed of NMOS transistors N12 and N13, the current mirror circuit as a load is formed of PMOS transistors P18 and P19, and the constant-current source for restricting the current flowing to the comparator CP is formed of an NMOS transistor N14 (a capacitor C2 is provided to stabilize the reference potential $VS_{REF}$).

Also, as shown in FIG. 7, the constant-current source for passing a constant current to the inverter I1 (the PMOS transistor P4 and the NMOS transistor N5) that receives the output voltage $V_C$ of the comparator CP is formed of an NMOS transistor N15. This allows application of a common voltage $V_{CON}$ to the gates of the NMOS transistor N14 and the NMOS transistor N15.

Seventh Preferred Embodiment

In the present invention, the reference potential $V_{REF}$ outputted from the reference voltage generating circuit 3 is susceptible to noise because it is generated using small current. Accordingly, in this preferred embodiment, as shown in FIG. 8, a noise filter circuit 4, composed of a resistor R3 and a capacitor C3, is provided at the node of the reference potential $V_{REF}$ (between the reference voltage generating circuit 3 and the detector circuit 2). In other respects, the configuration of the negative voltage generating circuit is the same as that shown in FIG. 1.

In this preferred embodiment, the comparator CP in the detector circuit 2 receives the reference potential $V_{REF}$ from which noise has been removed by the noise filter circuit 4. This prevents the malfunction that the detect signal $S_{DET}$ outputted by the detector circuit 2 unnecessarily varies due to noise, thus enabling stable operation of the detector circuit 2. This is especially effective when the detector circuit 2 is highly sensitive.

Eighth Preferred Embodiment

In the negative voltage generating circuit of the invention, noise may occur in the potential of the negative voltage $V_{NEG}$ at the time of power-feeding (activation) by the charge pump circuit 1 or at the time of current consumption by the semiconductor device. Accordingly, in this preferred embodiment, as shown in FIG. 9, a noise filter circuit 5, composed of a resistor R4 and a capacitor C4, is provided at the node of the negative voltage $V_{NEG}$ (between the charge pump circuit 1 (not shown) and the detector circuit 2). In other respects, the configuration of the negative voltage generating circuit is the same as that of FIG. 1.

In this preferred embodiment, the first voltage divider circuit 21 in the detector circuit 2 receives the negative voltage $V_{NEG}$ from which noise has been removed by the noise filter circuit 5. This reduces noise in the detect potential $V_{DIV}$ outputted from the first voltage divider circuit 21. This prevents the malfunction that the detect signal $S_{DET}$ outputted from the detector circuit 2 unnecessarily varies because of noise, thus enabling stable operation of the detector circuit 2. This is especially effective when the detector circuit 2 is highly sensitive.

This preferred embodiment may be combined with the seventh preferred embodiment. That is, the generative voltage generating circuit of the invention may include both of the noise filter circuit 4 for removing noise from the reference potential $V_{REF}$ as shown in FIG. 8 and the noise filter circuit 5 for removing noise from the negative voltage $V_{NEG}$ as shown in FIG. 9. Removing noise from both of the reference potential $V_{REF}$ and the negative voltage $V_{NEG}$ inputted to the detector circuit 2 enables more stable operation of the detector circuit 2.

Ninth Preferred Embodiment

In the preferred embodiments described so far, the generation of the detect potential $V_{DIV}$ in the first voltage divider circuit 21 is achieved by a voltage division between the power supply $V_{DD}$ and the negative voltage $V_{NEG}$ that is done by the NMOS transistors N1 and N2. A ninth preferred embodiment shows modifications in which the generation of the detect potential $V_{DIV}$ is achieved by using elements other than MOS transistors.

Figure 10:
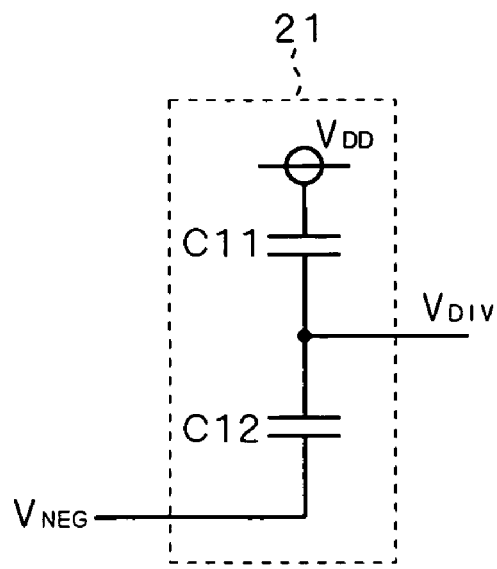
FIGS. 10 to 12 are diagrams showing examples of the configuration of a first voltage divider circuit according to a ninth preferred embodiment.

For example, FIG. 10 is a diagram showing an example in which the first voltage divider circuit 21 is formed of capacitors C11 and C12. That is, in this first voltage divider circuit 21, the capacitor C11 and the capacitor C12 make a voltage division between the power supply $V_{DD}$ and the negative voltage $V_{NEG}$ to generate the detect potential $V_{DIV}$. In this case, too, the effect of capacitive coupling by the capacitors C11 and C12 allows the detect potential $V_{DIV}$ to quickly follow variation of the negative voltage $V_{NEG}$. This offers the effect described in the first preferred embodiment, i.e., high-speed response superior to those of conventional detector circuits.

Figure 11:
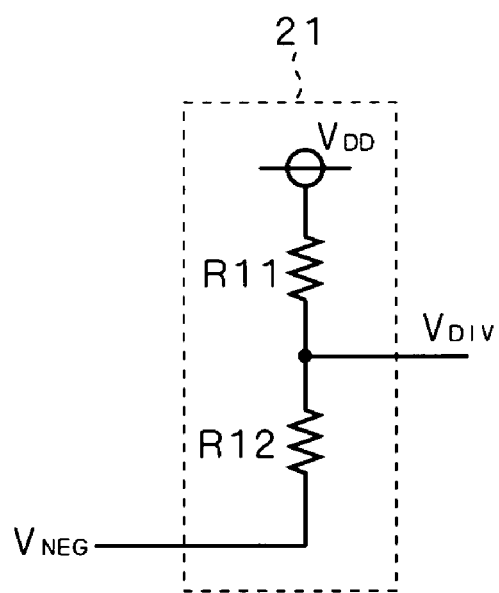

Also, FIG. 11 shows an example in which the first voltage divider circuit 21 is formed of resistors R11 and R12. That is, in this first voltage divider circuit 21, the resistor R11 and the resistor R12 make a voltage division between the power supply $V_{DD}$ and the negative voltage $V_{NEG}$ to generate the detect potential $V_{DIV}$. In this case, the effect of coupling is not obtained, and so high-speed response as described in the first preferred embodiment is not achieved. However, the through current flowing in the first voltage divider circuit 21 is reduced to achieve reduction of power consumption.

Researchers including the inventors of the present invention conducted simulations using SPICE (Simulation Program With Integrated Circuit Emphasis), and the results showed that the first voltage divider circuit 21 using the NMOS transistors N1 and N2 as shown in FIG. 1 exhibited through current variation of about 400 to 500% including those caused by variation in the manufacturing process (e.g., a variation in the range of 1 µA to 5 µA). On the other hand, the first voltage divider circuit 21 shown in FIG. 11, using the same polysilicon as the gate electrode material as the resistors R11 and R12, reduced the variation to about 20% (e.g., a variation in the range of 1 µA to 1.2 µA). That is, the first voltage divider circuit 21 of FIG. 11 realizes steady operation with reduced power consumption, though high-speed response as shown in the first preferred embodiment is not obtained.

Figure 12:
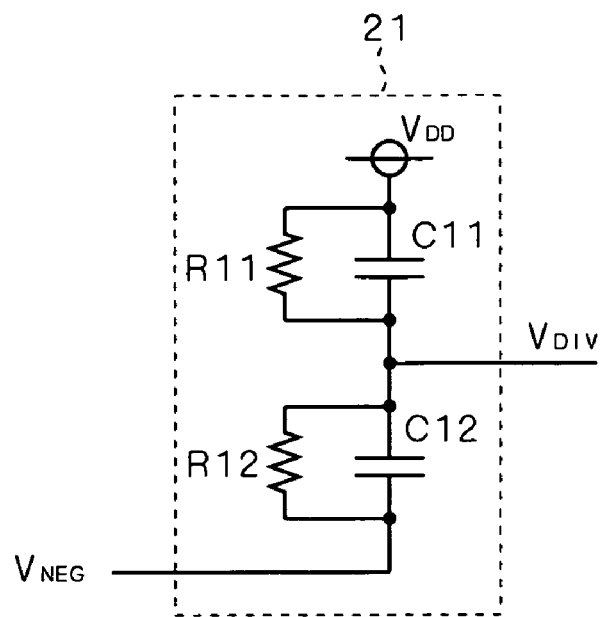

Also, as shown in FIG. 12, the resistors R11 and R12 may be connected in parallel respectively with the capacitors C11 and C12 to form a first voltage divider circuit 21. In this case, the capacitors C11 and C12 offer the effect of coupling and the resistors R11 and R12 suppress variation of through current. That is, the first voltage divider circuit 21 of FIG. 12 offers both of the superior high-speed response and the stable operation with reduced power consumption. However, it should be noted that, when the area of the formation of the polysilicon resistance used for the resistors R11 and R12 is large, its parasitic capacitance is not negligible, and it may hinder full achievement of the effect of coupling by the capacitors C11 and C12.

That is to say, as for the elements for forming the first voltage divider circuit 21, MOS transistors, capacitors, resistors, and combinations thereof can be suitably selected according to which factors are important for the application, among high-speed response, the magnitude of consumed current, stability, and area of formation. Particularly, the configuration such as the first voltage divider circuit 21 shown in FIG. 1, using MOS transistors, will be the most effective on the whole, because it is superior in all respects, including high-speed response, the magnitude of consumed current, stability, and area of formation.

In the negative voltage generating circuit shown in FIG. 1, the second voltage divider circuit 31, for generating the potential $V_{REFO}$ by making a voltage division between the power supply $V_{DD}$ and ground GND, is formed of the resistors R1 and R1. However, the second voltage divider circuit 31, too, may be formed of MOS transistors, resistors, or capacitors, like the first voltage divider circuit 21. However, in the negative voltage generating circuit of FIG. 1, it is not very important to cause the potential $V_{REFO}$ to quickly vary, and therefore it is desirable to form the second voltage divider circuit 31 with the resistors R1 and R2 as shown in FIG. 1 to achieve reduction of power consumption.

Tenth Preferred Embodiment

As mentioned earlier, the applications of the negative voltage generating circuit include semiconductor devices using a PMOS transistor as a DRAM cell transfer gate. This preferred embodiment describes a semiconductor device (DRAM device) including the negative voltage generating circuit and DRAM cell according to the invention, particularly a driving circuit for driving a word line to which the control electrode of the transfer gate of a DRAM cell is connected (a word line driver).

Figure 13:
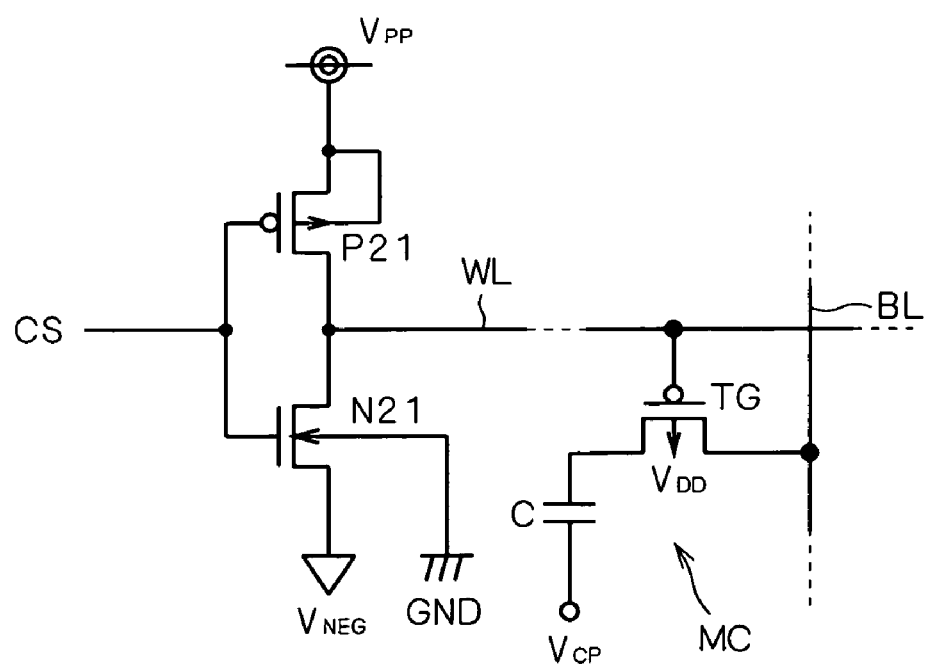
FIG. 13 is a circuit diagram of conventional word line driver and DRAM cell.

FIG. 13 is a circuit diagram of a DRAM cell using a PMOS transistor as a transfer gate, and a conventional common word line driver for driving the DRAM cell. As shown in FIG. 13, the word line driver is an inverter circuit formed of a PMOS transistor P21 and an NMOS transistor N21. The PMOS transistor P21 is connected between a word line WL and a power supply $V_{PP}$, and the NMOS transistor N21 is connected between the word line WL and a node of the negative voltage $V_{NEG}$. The gate electrodes of both of the PMOS transistor P21 and the NMOS transistor N21 receive a predetermined control signal CS.

As shown in FIG. 13, the word line WL is connected to the control electrode (gate electrode) of a transfer gate TG (PMOS transistor) in a DRAM cell MC. In the DRAM cell MC, one of the source/drain electrodes of the transfer gate TG is connected to a bit line BL, while the other is connected to a capacitor C holding a voltage corresponding to data. The capacitor C has the other end connected to a predetermined power supply $V_{CP}$. With the potential of the power supply $V_{CP}$ being defined as "$V_{CP}$" and the potential of the common power supply $V_{DD}$ (main power supply) shown above being defined as "$V_{DD}$", those potentials are commonly set such that $0 \leq V_{CP} \leq V_{DD}$.

On the basis of the control signal CS, when turning on the transfer gate TG of the DRAM cell MC, the word line driver in FIG. 13 supplies the word line WL with the potential of the negative voltage $V_{NEG}$ (a potential capable of extracting an L (Low) level signal with a sufficiently large amplitude from the DRAM cell MC). When turning off the transfer gate, the word line driver supplies the word line WL with the potential of the power supply $V_{PP}$ (a potential for preventing leakage of data of the DRAM cell MC). Usually, the power supply $V_{PP}$ is equal to the common power supply $V_{DD}$ (main power supply) shown above, or is of a higher voltage than that.

Figure 14:
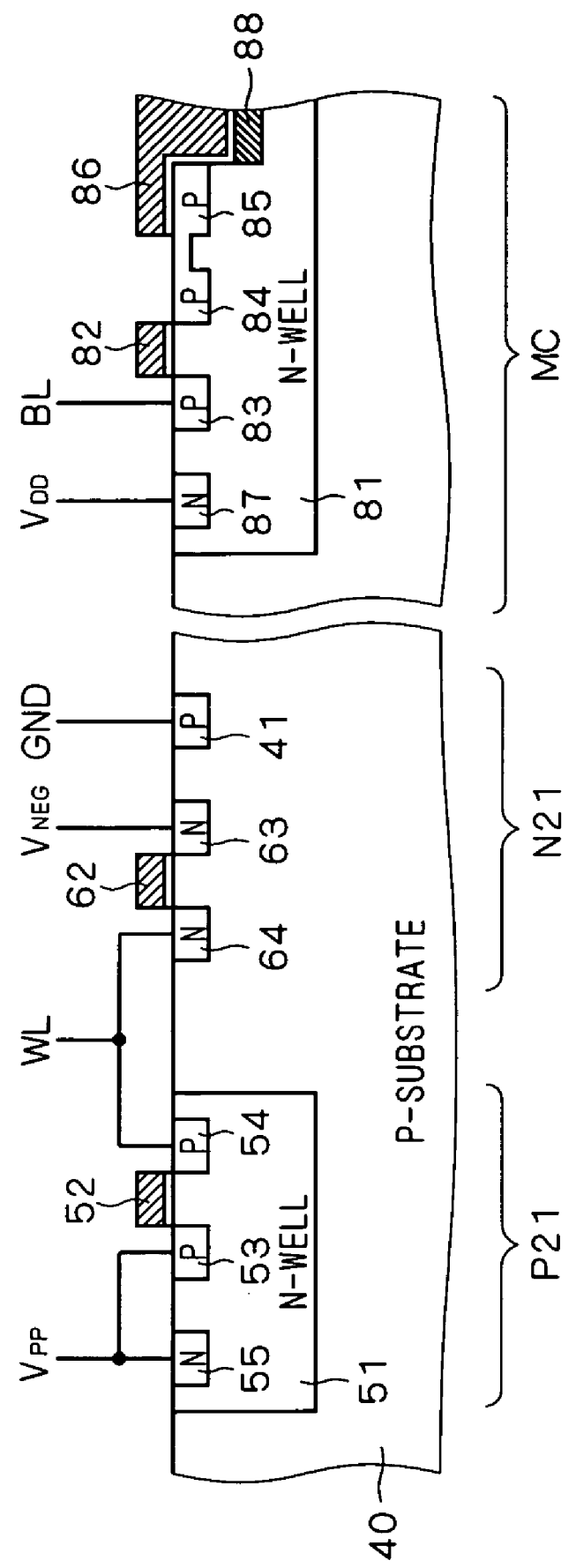
FIG. 14 is a cross-sectional view of the conventional word line driver and DRAM cell.

As shown in FIG. 13, in the conventional word line driver, the back gate of the PMOS transistor P21 is connected to the power supply $V_{PP}$ and the back gate of the NMOS transistor N21 is connected to the ground GND. FIG. 14 shows a cross-sectional view of the word line driver and the DRAM cell MC.

As shown in FIG. 14, the word line driver is formed in a P-type semiconductor substrate (P-type substrate) 40. In the P-type substrate 40, a P-type substrate contact region 41 is connected to the ground GND, and so the potential of the P-type substrate 40 is fixed at the potential of ground GND.

The PMOS transistor P21 is formed in an N well 51 and includes a gate electrode 52 formed on the N well 51 and a P-type source region 53 and a P-type drain region 54 formed on the sides of the gate electrode 52. The source region 53 is connected to the power supply $V_{PP}$ and the drain region 54 is connected to the word line WL. In the N well 51, an N-type well contact region 55 is connected to the power supply $V_{PP}$, and so the N well 51 (i.e., the back gate of the PMOS transistor P21) is electrically connected to the power supply $V_{PP}$.

The NMOS transistor N21 includes a gate electrode 62 formed on the P-type substrate 40 and an N-type source region 63 and an N-type drain region 64 formed on the sides of the gate electrode 62. The source region 63 is supplied with the negative voltage $V_{NEG}$ and the drain region 64 is connected to the word line WL. As mentioned above, the P-type substrate 40 (i.e., the back gate of the NMOS transistor N21) is connected to the ground GND.

As shown in FIG. 14, the DRAM cell MC is also formed in the P-type substrate 40. The transfer gate TG of the DRAM cell MC is formed in an N well 81, and includes a control electrode (gate electrode) 82 formed on the N well 81 and P-type source/drain regions 83 and 84 formed on the sides of the control electrode 82. The capacitor C has a P-type impurity region 85 connected to the source/drain region 84 as a lower electrode, and is composed of this impurity region 85 and an upper electrode 86 formed on the surface of the impurity region 85 via a dielectric film. In the N well 81, an N-type well contact region 87 connected to the power supply $V_{DD}$ is formed, and so the N well 81 (i.e., the back gate of the transfer gate TG) is electrically connected to the power supply $V_{DD}$. In the FIG. 14 example, part of the upper electrode 86 enters the upper part of trench isolation provided with an isolation insulating film 88, thus increasing an effective area of the capacitor C for capacity increase.

When the negative voltage $V_{NEG}$ is deep in the conventional word line driver as shown in FIG. 14, current flows from the ground GND to the node of the negative voltage $V_{NEG}$ through the substrate contact region 41, the P-type substrate 40, and the source region 63. Then, the potential of the negative voltage $V_{NEG}$ is fixed at the built-in potential ($\Phi bi \approx -0.5$ V) and does not become deeper than that. Accordingly, in this case, it is not necessary to provide the detector circuit in the negative voltage generating circuit that generates the negative voltage $V_{NEG}$. However, the power consumption of the word line driver is large because of the current flowing from the ground GND to the node of the negative voltage $V_{NEG}$.

Figure 15:
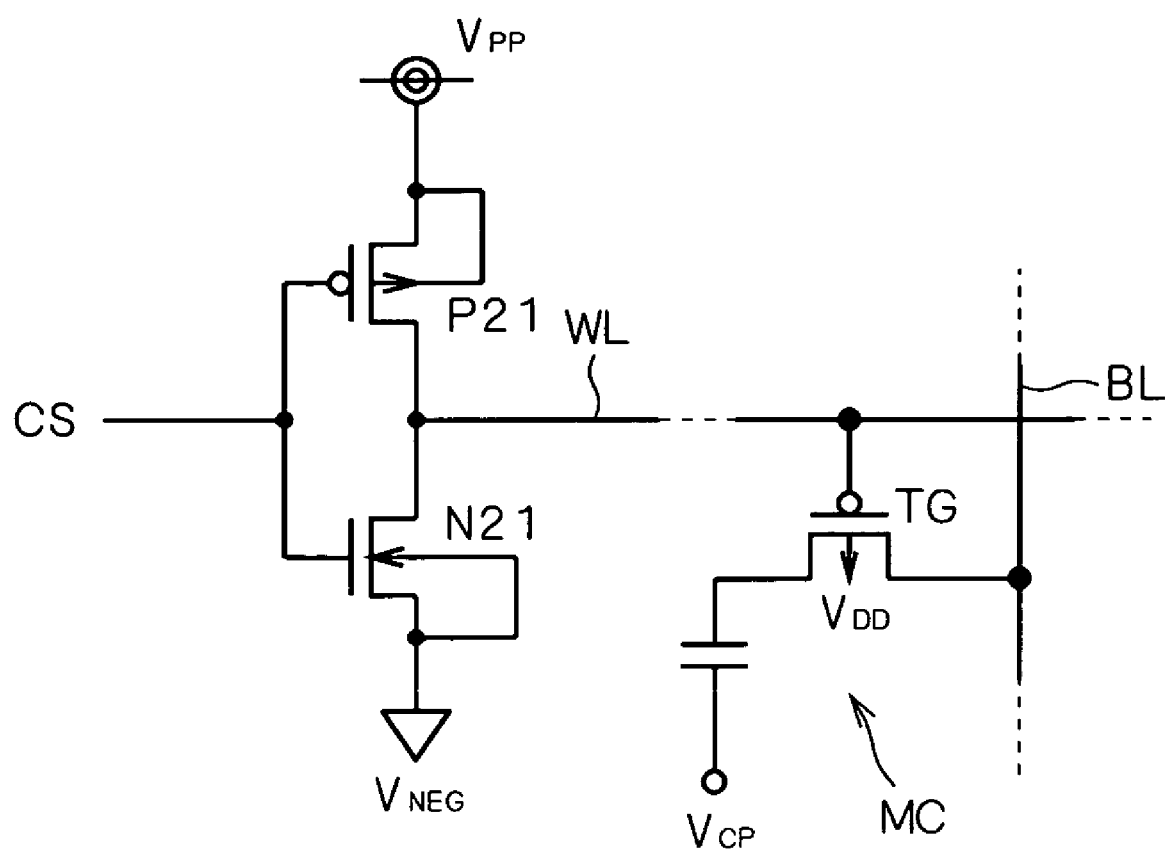
FIG. 15 is a circuit diagram of a word line driver and a DRAM cell according to a tenth preferred embodiment.
Figure 16:
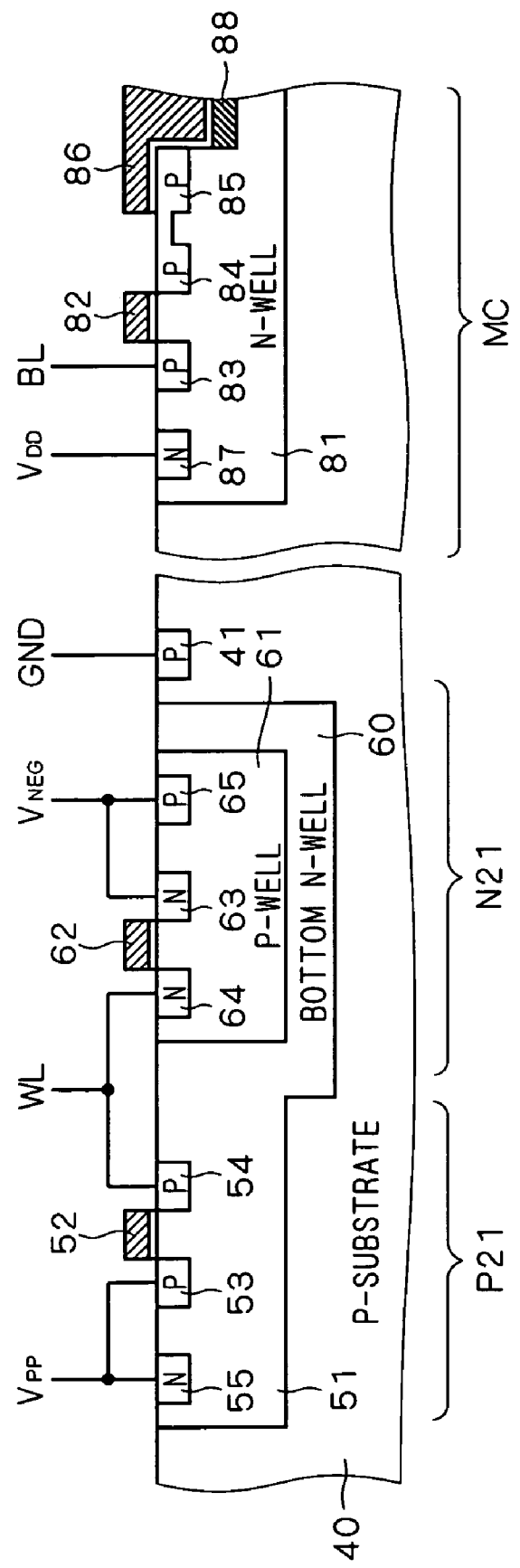
FIG. 16 is a cross-sectional view of the word line driver and the DRAM cell according to the tenth preferred embodiment.

Recently, the widespread use of mobile devices is increasingly demanding reduction of power consumption of DRAM devices used in the mobile devices. FIG. 15 is a circuit diagram of a word line driver and the DRAM cell according to this preferred embodiment, and FIG. 16 is its cross-sectional view. In FIGS. 15 and 16, the components having the same functions as those of FIGS. 13 and 14 are shown at the same reference characters.

As shown in FIG. 15, in the word line driver of the preferred embodiment, the back gate of the NMOS transistor N21 is connected to the negative voltage $V_{NEG}$. In other respects, the circuit configuration is the same as that shown in FIG. 13. The operation is also the same as that of the word line driver of FIG. 13, and the word line driver operates on the basis of the control signal CS to supply the potential of the negative voltage $V_{NEG}$ to the word line WL when turning on the transfer gate TG of the DRAM cell MC, and supplies the potential of the power supply $V_{PP}$ to the word line WL when turning off the transfer gate.

As shown in FIG. 16, the word line driver of the preferred embodiment is also formed in a P-type substrate 40. In the P-type substrate 40, a P-type substrate contact region 41 is connected to the ground GND and so the potential of the P-type substrate 40 is fixed at the potential of the ground GND.

The PMOS transistor P21 is constructed as shown in FIG. 14. That is, the PMOS transistor P21 includes a gate electrode 52 on the N well 51 and a source region 53 and a drain region 54 on the sides of the gate electrode 52. The source region 53 is connected to the power supply $V_{PP}$ and the drain region 54 is connected to the word line WL. The N well 51 (i.e., the back gate of the PMOS transistor P21) is connected to the power supply $V_{PP}$ through the well contact region 55.

On the other hand, the NMOS transistor N21, unlike that shown in FIG. 14, is formed in a P well 61 in an N-type bottom N well 60, and has a so-called "triple well" structure. In this preferred embodiment, the bottom N well 60 and the N well 51 are formed integrally. Therefore, as well as the potential of the N well 51, the potential of the bottom N well 60 is equal to the potential of the power supply $V_{PP}$.

The NMOS transistor N21 includes a gate electrode 62 on the P well 61 and a source region 63 and a drain region 64 on the sides of the gate electrode 62. The source region 63 is supplied with the negative voltage $V_{NEG}$ and the drain region 64 is connected to the word line WL. The P well 61 (the back gate of the transistor N21) is supplied with the negative voltage $V_{NEG}$ through a P-type well contact region 65.

In the structure of FIG. 16, the bottom N well 60 electrically separates the P-type substrate 40 at the ground GND potential and the P well 61 (negative voltage $V_{NEG}$) at the negative voltage $V_{NEG}$ potential. Therefore, current does not flow between the ground GND and the node of the negative voltage $V_{NEG}$, and the consumed current is smaller than that of the word line driver of FIG. 14, which contributes to reduction of power consumption of the DRAM device. However, it should be noted that the triple well structure may involve a larger area for formation.

In this case, the potential of the negative voltage $V_{NEG}$ can become deeper than the built-in potential, so that it is effective to suppress the variation of the negative voltage $V_{NEG}$ by using the negative voltage generating circuit having the detector circuit 2 of the invention. The adoption of the negative voltage generating circuit having the detector circuit 2 allows arbitrary setting of the level of the negative voltage $V_{NEG}$ and quick detection of its variation, thereby allowing stable supply of the negative voltage $V_{NEG}$. Particularly, an application combined with the detector circuit 2 having the current cut function shown in the third preferred embodiment further reduces the power consumption of the DRAM device.

Figure 17:
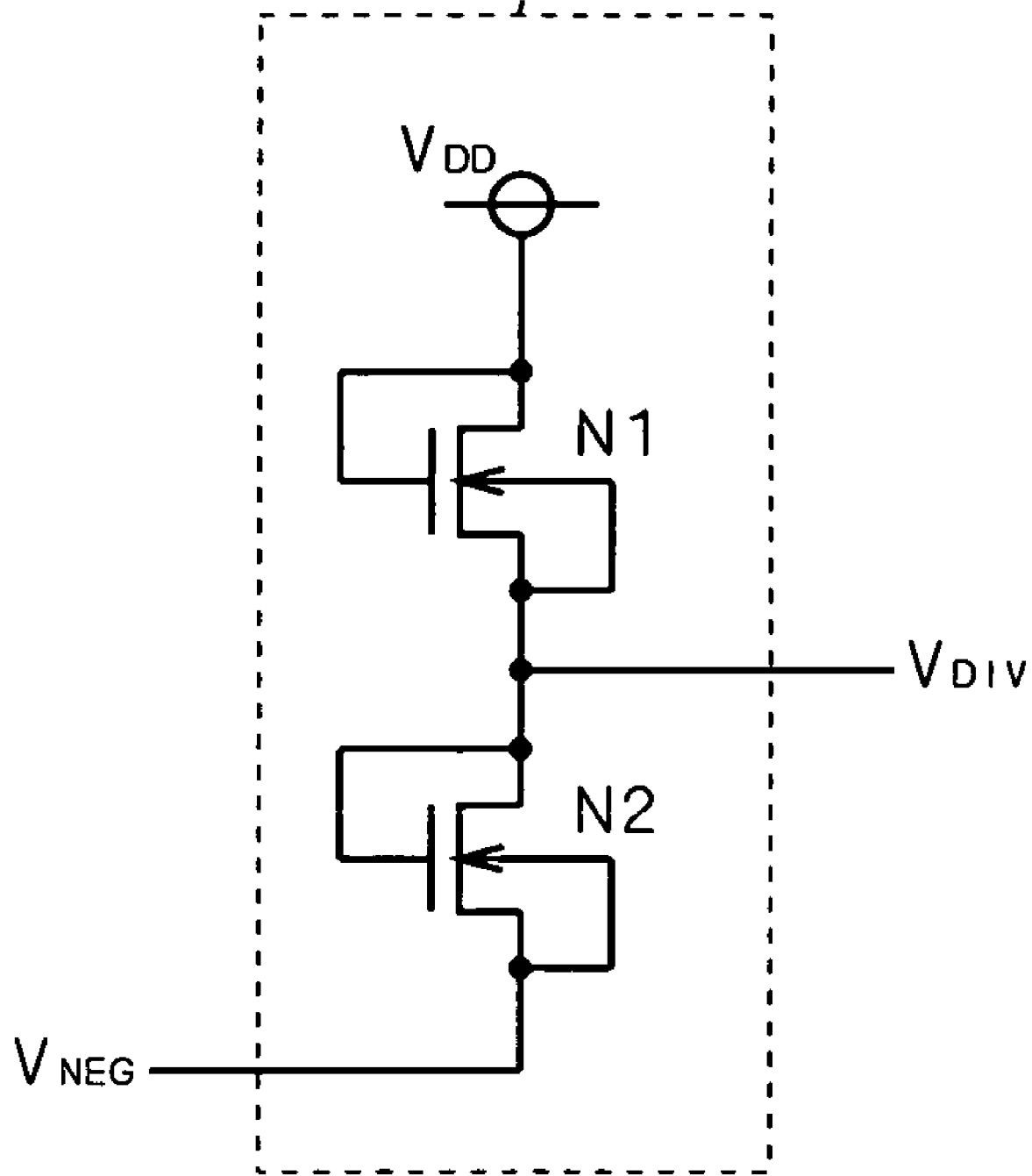
FIG. 17 is a circuit diagram of a first voltage divider circuit according to the tenth preferred embodiment.

When the NMOS transistor N21 of the word line driver has a triple well structure as shown in FIG. 16, it is effective to form the NMOS transistors N1 and N2 with a triple well structure in the first voltage divider circuit 21 (FIG. 17) of the negative voltage generating circuit that supplies the negative voltage $V_{NEG}$ thereto.

FIG. 18 shows a cross-sectional view of the first voltage divider circuit 21 which adopts the triple well structure. As shown in FIG. 18, the NMOS transistors N1 and N2 are formed respectively in P wells 171 and 271 in a bottom N well 70 formed in the P-type substrate 40. The bottom N well 70 is connected to the power supply $V_{DD}$ through a well contact region 71.

The NMOS transistor N1 includes a gate electrode 172 on the P well 171 and a source region 173 and a drain region 174 on the sides of the gate electrode 172, and the NMOS transistor N2 includes a gate electrode 272 on the P well 271 and a source region 273 and a drain region 274 on the sides of the gate electrode 272. The P wells 171 and 271 respectively have well contact regions 175 and 275 formed therein as the back gate terminals of the NMOS transistors N1 and N2, respectively.

When the NMOS transistors N1 and N2 of the first voltage divider circuit 21 and the NMOS transistor N21 of the word line driver are formed with a triple well structure as shown in FIGS. 16 and 18, they can be fabricated in parallel in the same manufacturing process, which minimizes the complexity of the DRAM device manufacturing process caused by the adoption of the triple well structure.

Also, while this preferred embodiment has shown an example in which the first voltage divider circuit 21 is formed of MOS transistors, the first voltage divider circuit 21 may be formed of capacitors or resistors as shown in FIGS. 10 to 12.

With respect to the relationship between the absolute value of the potential of the positive power supply $V_{DD}$ and the absolute value of the potential of the negative voltage $V_{NEG}$, it is desirable that the absolute value of the potential of the positive power supply $V_{DD}$ be the larger. In that case, the first voltage divider circuit 21 of the detector circuit 2 shown in FIG. 1 outputs the detect potential $V_{DIV}$ as a positive potential. When the potential of the power supply $V_{DD}$ is from 1.0 to 1.5 V, for example, the potential of the negative voltage $V_{NEG}$ should be set from approximately −0.3 to −0.8.

While the invention has been described in detail, the foregoing description is in all aspects illustrative and not restrictive. It is understood that numerous other modifications and variations can be devised without departing from the scope of the invention.

What is claimed is:

1. A semiconductor device comprising a detector circuit that detects a level of a negative voltage, and a reference potential generating circuit that generates a reference potential, wherein said detector circuit includes a first voltage divider circuit including a plurality of MOS transistors connected in series between a potential of said negative voltage and a positive power-supply potential, said plurality of MOS transistors being configured to cause a voltage division between said negative voltage potential and said positive power-supply potential, and said first voltage divider circuit being configured to output a detect potential generated by the voltage division between said negative voltage potential and said positive power-supply potential;

wherein said reference potential generating circuit includes a second divider circuit configured to generate said reference potential by obtaining an intermediate reference potential from a voltage division between said positive power-supply potential and ground;

wherein said reference potential generating circuit further includes an adjustment circuit configured to decrease said intermediate reference potential by a predetermined adjustment value to obtain said reference potential;

wherein said detector circuit further includes first and second level shift circuits that respectively shift said detect potential and said reference potential to predetermined potential levels;

wherein said detector circuit further includes a comparator circuit that compares said level-shifted detect potential and said level-shifted reference potential respectively outputted by said first and second level shift circuits;

wherein said semiconductor device further comprises a charge pump circuit being driven by an output signal from said comparator circuit and configured to generate said negative voltage in accordance with said reference potential; and wherein said detector circuit, said charge pump circuit, and said reference potential generating circuit form a negative voltage generating circuit that outputs said negative voltage.

2. The semiconductor device according to claim 1, further comprising a first noise filter circuit that removes noise from said reference potential and then provides the noise-removed reference potential to said second level shift circuit.

3. The semiconductor device according to claim 1, further comprising a second noise filter circuit that removes noise from said negative voltage and then provides the noise-removed negative voltage to said first voltage divider circuit.

4. The semiconductor device according to claim 1, further comprising:
a DRAM (Dynamic Random Access Memory) cell; and
a word line driver that drives a word line of said DRAM cell,
wherein said word line driver comprises an NMOS transistor having its drain connected to said word line and its source supplied with said negative voltage, and
said NMOS transistor is formed in a P well in a bottom N well formed in a P-type substrate.

5. The semiconductor device according to claim 1, wherein said detect potential outputted from said first voltage divider circuit is substantially an intermediate potential between said negative voltage potential and said positive power-supply potential caused by the voltage division between said negative voltage potential and said positive power-supply potential.

6. The semiconductor device according to claim 1, wherein said detect potential is equal to one half of the difference between said positive power-supply potential and said negative voltage potential.

7. The semiconductor device according to claim 1, wherein a first number of MOS transistor(s) between said positive power-supply potential and an output part of said first voltage divider circuit at which said detect potential is outputted is equal to a second number of MOS transistor(s) between said output part and said negative voltage potential.

8. The semiconductor device according to claim 1, wherein said comparator circuit is configured to compare said level-shifted detect potential outputted from said first level shift circuit and said level-shifted reference potential outputted from said second level shift circuit to detect the level of said negative voltage.

* * * * *